United States Patent
Kang

(10) Patent No.: US 7,964,501 B2
(45) Date of Patent: Jun. 21, 2011

(54) SEMICONDUCTOR DEVICE AND METHOD OF FABRICATING THE SAME

(75) Inventor: Dae In Kang, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 207 days.

(21) Appl. No.: 11/967,267

(22) Filed: Dec. 31, 2007

(65) Prior Publication Data

US 2009/0108461 A1 Apr. 30, 2009

(30) Foreign Application Priority Data

Oct. 31, 2007 (KR) .................. 10-2007-0110737

(51) Int. Cl.
*H01L 21/44* (2006.01)

(52) U.S. Cl. . 438/666; 257/774; 257/773; 257/E29.111; 257/E29.112; 438/578; 438/640

(58) Field of Classification Search .................. 257/774, 257/773, E29.111, E29.112, E21.646, E21.648; 438/578, 666, 640, 253–255
See application file for complete search history.

(56) References Cited

U.S. PATENT DOCUMENTS

| 5,668,036 | A | * | 9/1997 | Sune | 438/253 |
|---|---|---|---|---|---|
| 6,127,712 | A | * | 10/2000 | Wu | 257/410 |
| 6,255,161 | B1 | * | 7/2001 | Lin | 438/254 |
| 7,511,257 | B2 | * | 3/2009 | Lee et al. | 250/214.1 |
| 2001/0001717 | A1 | * | 5/2001 | Kumauchi et al. | 438/197 |
| 2001/0045665 | A1 | * | 11/2001 | Okumura | 257/774 |
| 2005/0077560 | A1 | * | 4/2005 | Shiratake | 257/296 |
| 2005/0263814 | A1 | * | 12/2005 | Kim et al. | 257/306 |
| 2006/0220544 | A1 | * | 10/2006 | Okuyama et al. | 313/506 |
| 2007/0001306 | A1 | * | 1/2007 | Su et al. | 257/758 |
| 2007/0004192 | A1 | * | 1/2007 | Park et al. | 438/622 |
| 2007/0032091 | A1 | * | 2/2007 | Heald et al. | 438/758 |

FOREIGN PATENT DOCUMENTS

| KR | 1020000045375 A | 7/2000 |
|---|---|---|
| KR | 1020020094961 A | 12/2002 |
| KR | 1020060063299 A | 6/2006 |
| KR | 100699915 B1 | 3/2007 |

* cited by examiner

*Primary Examiner* — N Drew Richards
*Assistant Examiner* — Yu-Hsi Sun
(74) *Attorney, Agent, or Firm* — Kilpatrick Townsend & Stockton LLP

(57) ABSTRACT

A method of fabricating a semiconductor device includes providing a semiconductor substrate including a first landing plug and a second landing plug. A bit line is formed over the semiconductor substrate. The bit line is electrically coupled to the first landing plug. A stacked structure of an etch stop film and an interlayer insulating film is deposited over the semiconductor substrate including the bit line. The stacked structure is selectively etched using a contact mask to form a contact hole having an upper part that is wider than a lower part of the contact hole. The contact hole exposes the second landing plug. A contact plug is formed over the contact hole. The contact plug is electrically coupled to the second landing plug.

13 Claims, 4 Drawing Sheets

SEMICONDUCTOR DEVICE AND METHOD OF FABRICATING THE SAME

CROSS-REFERENCES TO RELATED APPLICATIONS

This application claims priority of Korean patent application number 10-2007-0110737, filed on Oct. 31, 2007, which is incorporated by reference in its entirety.

BACKGROUND OF THE INVENTION

The invention generally relates to a semiconductor device. More particularly, the invention relates to a semiconductor device including a storage node and a method of fabricating the same.

Generally, a Dynamic Random Access Memory (DRAM) cell includes a capacitor for storing charges that represent information to be stored and a transistor for addressing the stored charges in the capacitor. The transistor formed over a semiconductor substrate also includes a gate that controls a current flowing between source/drain regions. Charges stored in the capacitor can be accessed through the transistor. Capacitance C refers to the amount of electric charge stored in a capacitor. As the capacitance becomes larger, more information can be stored.

The capacitance is represented by Equation 1.

$$C = \varepsilon \frac{A}{d} \quad \text{Equation 1}$$

$\varepsilon$ is a dielectric constant determined by different types of dielectric films disposed between two electrodes, d is a distance between the two electrodes, and A is an effective surface area of the two electrodes. Referring to Equation 1, the capacitance of the capacitor can be increased by increasing $\varepsilon$, reducing d and/or increasing A. The electrode structure of the capacitor may be changed to be three-dimensional such as a concave structure or a cylindrical structure, thereby increasing the effective area of the electrodes.

A concave-structured capacitor includes a hole formed in an interlayer insulating film where a lower electrode is formed. A lower electrode of the capacitor is formed in the hole. A dielectric film and an upper electrode are deposited over the lower electrode. Due to the high-integration of semiconductor devices, it is difficult to secure a sufficient capacitance required in each cell of a limited cell area even in the concave-structured capacitor. As a result, a cylinder-structured capacitor has been developed to provide a surface area that is larger than the surface area of the concave-structured capacitor.

The cylinder-structured capacitor includes a hole formed in an interlayer insulating film where a lower electrode region of the capacitor is defined. A lower electrode of the capacitor is formed in the hole, and the interlayer insulating film is removed, which is called as a dip-out process. A dielectric film and an upper electrode are deposited over the residual lower electrode. The cylinder-structured capacitor can use the inner and outer surfaces of the lower electrode as an effective surface area, resulting in a capacitance that is larger than that of the concave-structured capacitor.

However, misalignment may occur in the capacitor due to the lack of an overlap margin between a storage node and storage node contact plug. As a result of the misalignment during an etching process for forming a storage node region, the interlayer insulating film, which electrically isolates storage node contact plugs from each other, is also etched. In addition, a bit line disposed below the interlayer insulating film is exposed due to the etched interlayer insulating film. As a result, a failure in self-align contact (SAC) etching may occur.

SUMMARY OF THE INVENTION

Embodiments of the present invention are directed to a semiconductor device. According to an embodiment of the invention, the semiconductor device includes an interlayer insulating film having an etch stop film that electrically isolates storage node contact plugs from each other. Thus, during an etching process for forming a storage node region, a bit line can be prevented from being etched. In addition, the interlayer insulating film has two different materials each having a different etch rate, thereby forming a storage node contact plug having a wine glass form. Accordingly, a substantial overlap margin can be obtained between the storage node and the storage node contact plug.

According to an embodiment of the present invention, a method of fabricating a semiconductor device includes: providing a semiconductor substrate including a first landing plug and a second landing plug. A bit line is formed over the semiconductor substrate. The bit line is electrically coupled to the first landing plug. A stacked structure of an etch stop film and an interlayer insulating film is deposited over the semiconductor substrate including the bit line. The stacked structure is selectively etched using a contact mask to form a contact hole having an upper part that is wider than a lower part of the contact hole. The contact hole exposes the second landing plug. A contact plug is formed over the contact hole. The contact plug is electrically connected with the second landing plug.

According to an embodiment of the present invention, a semiconductor device includes a storage node contact plug formed by the above described method. A width of an upper part of the storage node contact plug is larger than that of a lower part of the storage node contact plug.

DESCRIPTION OF EMBODIMENTS

Figure 1A:
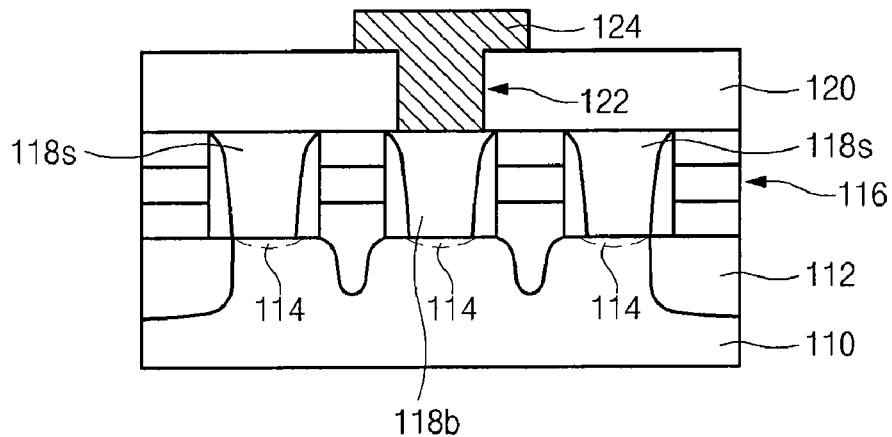
FIGS. 1a to 1h are cross-sectional views illustrating a method for fabricating a semiconductor device according to an embodiment of the present invention.

The present invention relates to a semiconductor device including a storage node contact plug. According to an embodiment of the present invention, the storage node contact plug is formed by selectively etching an interlayer insulating film having an etch stop film, forming a storage node contact hole by cleaning the etched surface of the interlayer insulating film in which a width of an upper part of the storage node contact hole is greater than that of a lower part of the storage node contact hole, and filling the storage node contact hole with a conductive layer.

More particularly, the interlayer insulating film having the etch stop film that electrically isolates the storage node contact plugs from each other has at least two different materials each having a different etch rate, thereby securing a margin of an etching process for forming a storage node region. In addition, an overlap margin can be obtained between a storage node and the storage node contact plug. The interlayer insulating film may include a stacked structure of a first insulating film, an etch stop film, and a second insulating film having an etch rate that is relatively faster than that of the first insulating film.

FIGS. 1a to 1h are cross-sectional views illustrating a method of fabricating a semiconductor device in accordance with an embodiment of the present invention. A first interlayer insulating film 120 is formed over a semiconductor substrate 110 including a device isolation structure 112, a source/drain region 114, a gate 116, landing plugs 118b and 118s, and so on. First interlayer insulating film 120 is selectively etched using a mask (not shown) that defines a bit line contact region, to form a bit line contact hole 122 that exposes land plug 118b. A bit line conductive layer (not shown) and a bit line hard mask layer (not shown) are deposited over first interlayer insulating film 120. The bit line conductive layer and the bit line hard mask layer are patterned using a bit line mask (not shown) as an etching mask to form a bit line 124 that is electrically connected with landing plug 118b. Bit line 124 comprises a tungsten (W) layer. Hereinafter, landing plug 118b that is electrically coupled to bit line 124 is defined as a "bit line land plug" (or a "first landing plug"), and landing plug 118s that is electrically coupled to a storage node is defined as a "storage node landing plug" (or a "second landing plug").

Figure 1B:
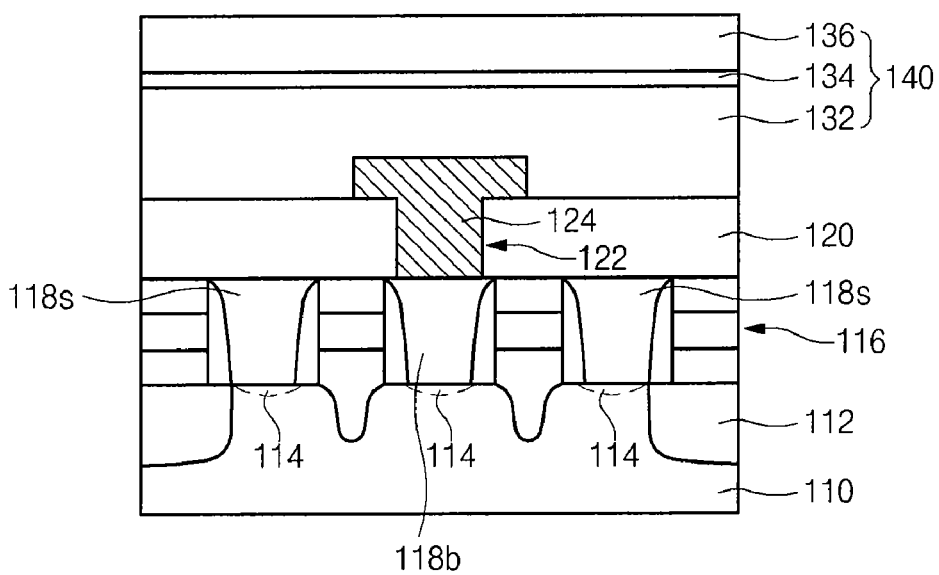

Referring to FIG. 1b, a second interlayer insulating film 140 is formed over bit line 124 and first interlayer insulating film 120. Second interlayer insulating film 140 comprises an etch stop film 134. Etch stop film 134 behaves as a barrier film to prevent bit line 124 from being etched during a subsequent etching process or cleaning process. Second interlayer insulating film 140 may be a High density plasma (HDP) oxide film, a Spin-on-dielectric (SOD) oxide film, a nitride film, or combinations thereof. Preferably, second interlayer insulating film 140 comprises a stacked structure of a first insulating film 132, an etch stop film 134, and a second insulating film 136. First insulating film 132 comprises a HDP oxide film having a thickness in the range of about 500 Å to 5,000 Å. Etch stop film 134 comprises a nitride film having a thickness in the range of about 50 Å to 1,000 Å. Second insulating film 136 comprises a SOD oxide film having a thickness in the range of about 500 Å to 6,000 Å.

Figure 1C:
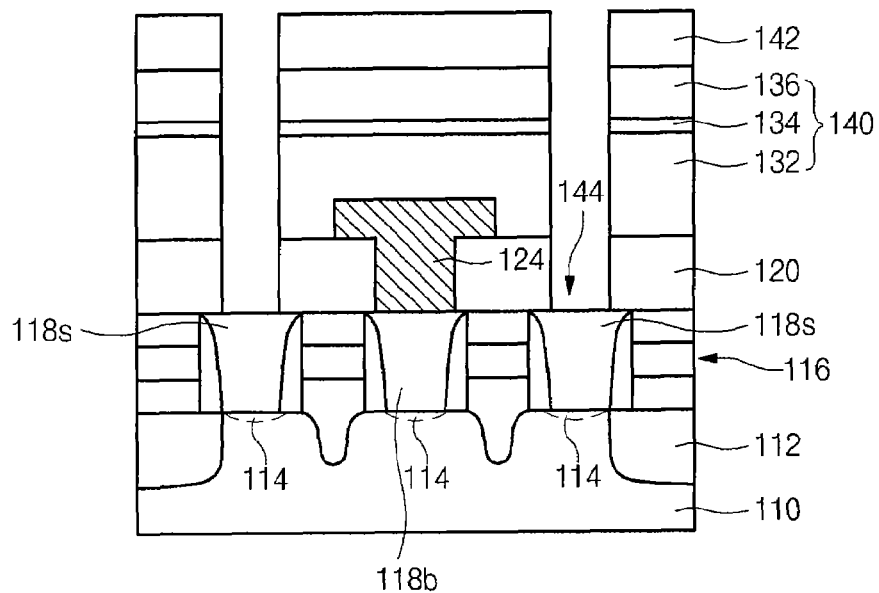

Referring to FIG. 1c, a mask pattern 142 that defines a storage node contact region (not shown) is formed over second interlayer insulating film 140. Second interlayer insulating film 140 is selectively etched using mask pattern 142 as an etching mask to form a first storage node contact hole 144 that exposes storage node landing plug 118s. The process of selectively etching second interlayer insulating film 140 comprises a dry etching process. The dry etching process is performed under a pressure in the range of 15 mTorr to 50 mTorr and a power in the range of 1,000 W to 2,000 W and using a gas comprising essentially fluorocarbon and optionally at least one of fluoro hydrocarbon, oxygen, carbon monoxide and an inert gas such as Ar or $N_2$. For example, the dry etching gas may be mixture of $C_4F_8$, $O_2$ and CO, mixture of $C_2F_6$, $C_2HF_5$ and $CHF_3$ or mixture of $C_2F_6$, $CHF_3$, $CF_4$, Ar, $C_4F_8$ and $CH_3F$.

Figure 1D:
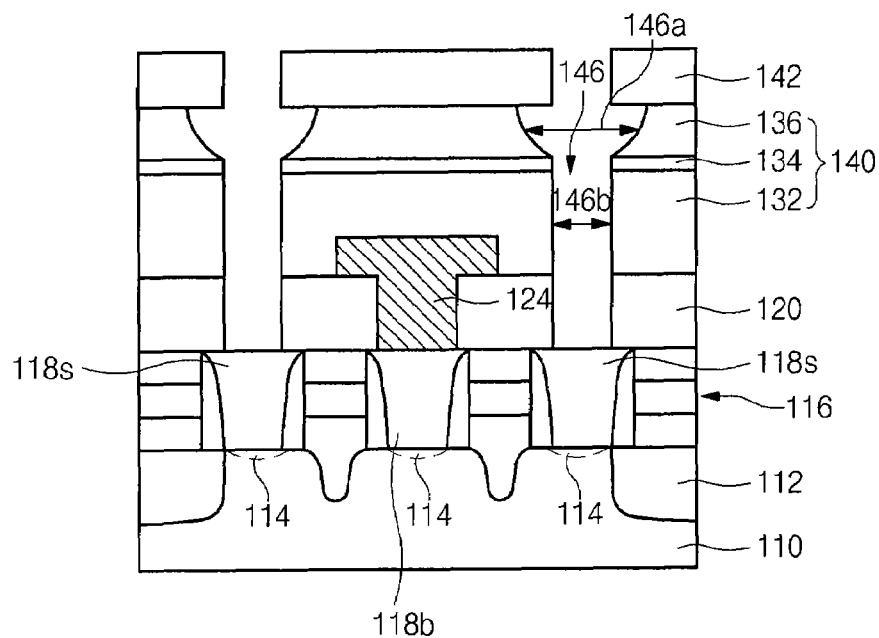

Referring to FIG. 1d, a cleaning process is performed on the surface of first storage node contact hole 144 to form a second storage node contact hole 146. A width 146a of an upper part of second storage node contact hole 146 is greater than a width 146b of a lower part of second storage node contact hole 146. The cleaning process is performed using a Buffer oxide etchant (BOE) solution, a HF solution, or a combination thereof. During the cleaning process, the etch rate of second insulating film 136 is faster than that of first insulating film 132, thereby obtaining second storage node contact hole 146 having upper width 146a greater than lower width 146b. For example, during the cleaning process, the etch rate of second insulating film 136 is at least 10 times faster than that of first insulating film 132. The cleaning process can be adjusted so as not to connect an upper part of second storage node contact hole 146 with a neighboring second storage node contact hole 146.

Figure 1E:
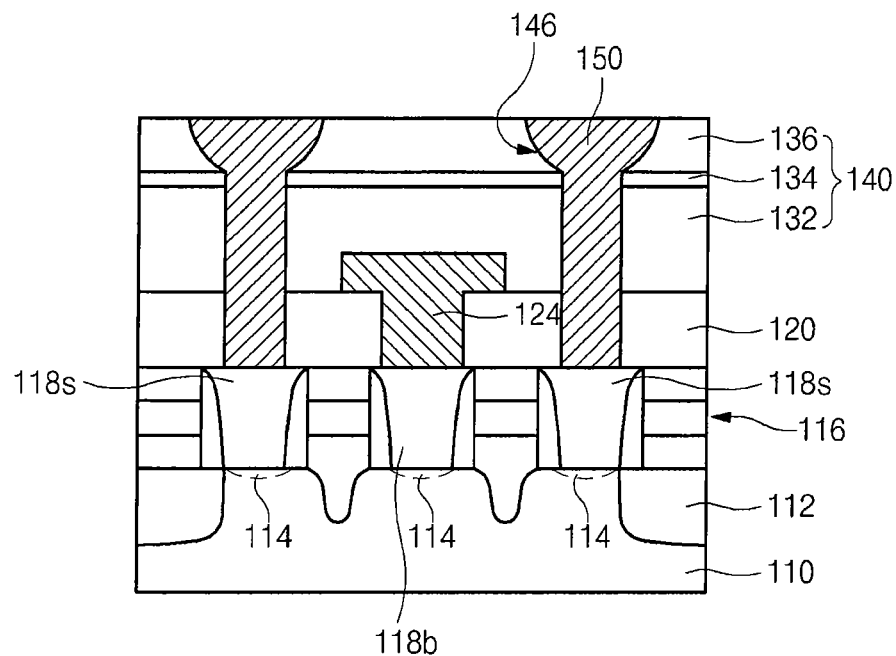

Referring to FIG. 1e, a conductive layer (not shown) is formed over second storage node contact hole 146 and mask pattern 142 to fill second storage node contact hole 146. The conductive layer is planarized until second interlayer insulating film 140 is exposed, to form a storage node contact plug 150 that is electrically coupled to storage node landing plug 118s. The planarizing process is performed using a chemical mechanical polishing (CMP) method, an etch-back method, or a combination thereof. The conductive layer comprises a polysilicon layer.

Figure 1F:
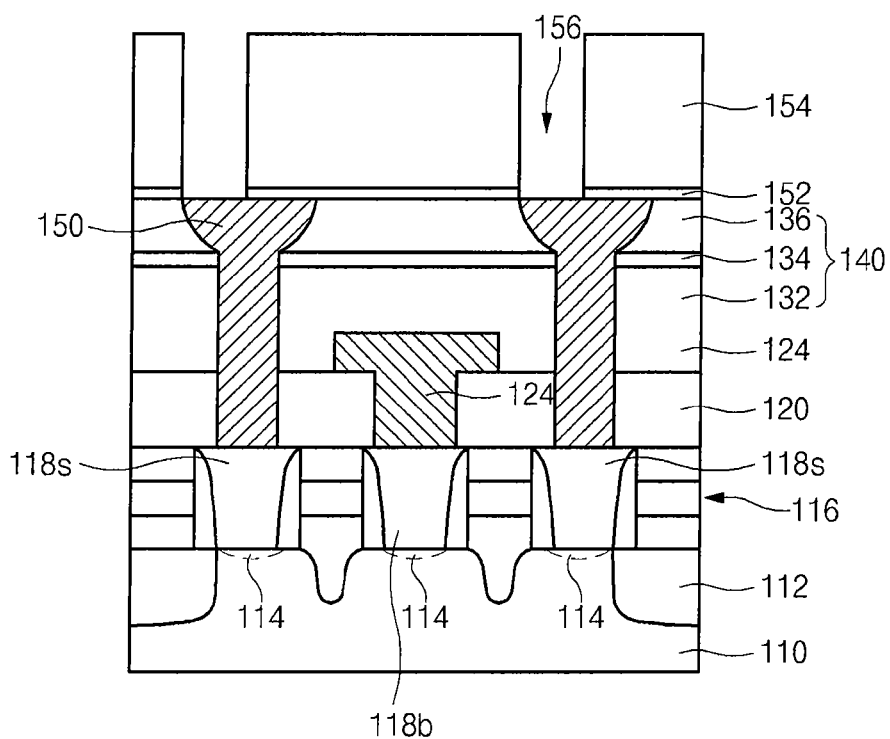
Figure 1G:
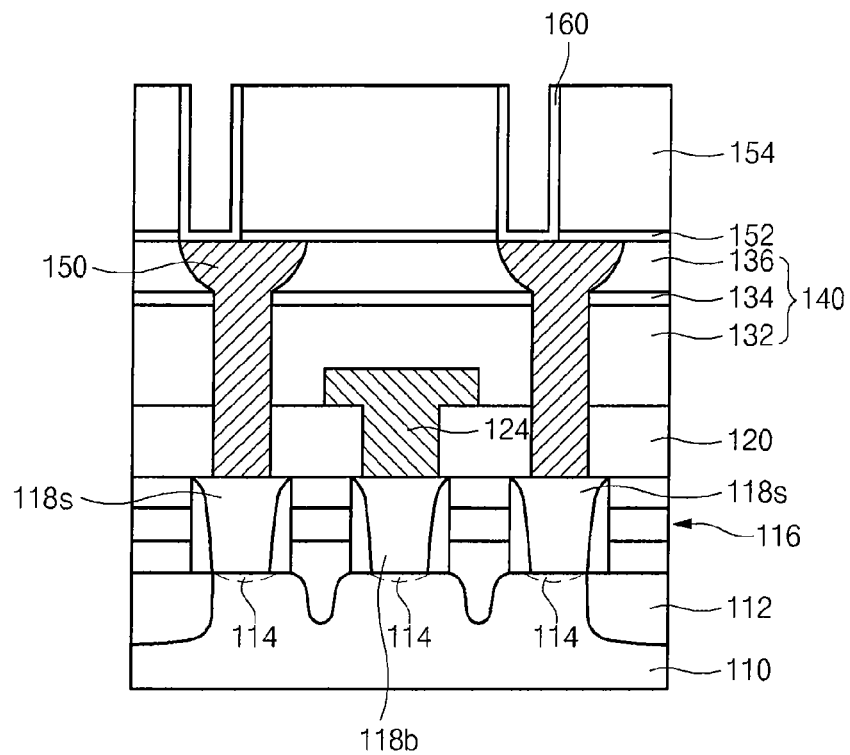
Figure 1H:
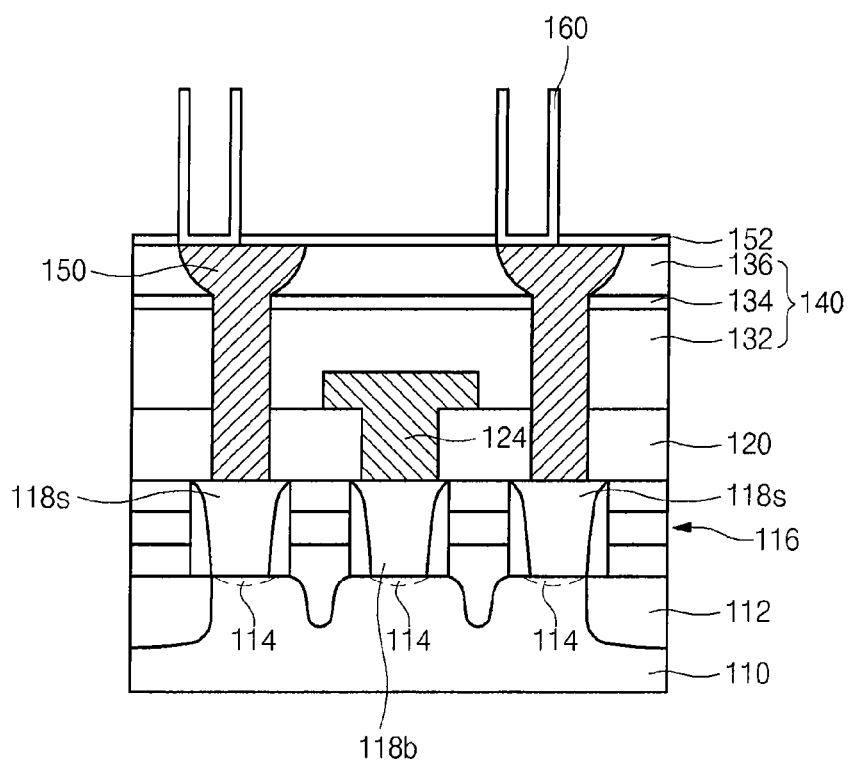

Referring to FIGS. 1f to 1h, second etch stop film 152 is formed over storage node contact plug 150 and second interlayer insulating film 140. A third interlayer insulating film 154 is formed over second etch stop film 152. Third interlayer insulating film 154 may be a Phospho silicate glass (PSG) oxide film, a Plasma enhanced TEOS (PE-TEOS) oxide film, or a combination thereof. Third interlayer insulating film 154 and second etch stop film 152 are selectively etched using a mask (not shown) that defines a storage node region, to form a storage node region 156 that exposes a portion of storage node contact plug 150.

A second conductive layer (not shown) is formed over third interlayer insulating film 154 including storage node region 156. The second conductive layer may be a titanium (Ti) layer, a titanium nitride (TiN) film, or a combination thereof. In addition, the process of planarizing the second conductive layer is performed using a CMP method or an etch-back method. A dip-out process is performed on third interlayer insulating film 154 to expose lower electrode 160. Subsequent processes are performed using well known processes including a process of forming a dielectric film, a process of forming an upper electrode, and so on, to obtain a capacitor.

As described above, the present invention can obtain a substantial overlap margin between the storage node and the storage node contact plug. In addition, the present invention can secure a SAC etching margin between the storage node and the bit line. Accordingly, the yield and reliability of the devices can be improved.

The above embodiments of the present invention are illustrative and not limitative. Various alternatives and equivalents are possible. The invention is not limited by the lithography steps described herein. Nor is the invention limited to any specific type of semiconductor device. For example, the present invention may be implemented in a dynamic random access memory (DRAM) device or non-volatile memory device. Other additions, subtractions, or modifications are obvious in view of the present disclosure and are intended to fall within the scope of the appended claims.

What is claimed is:

1. A method of fabricating a semiconductor device, the method comprising:
    providing a semiconductor substrate including a first landing plug and a second landing plug;
    forming a bit line over the semiconductor substrate, wherein the bit line is electrically coupled to the first landing plug;
    forming a stacked structure including a first insulating film, an etch stop film, and a second insulating film over the semiconductor substrate and the bit line;
    forming a mask pattern over the stacked structure to define a contact hole region;

selectively etching the stacked structure with the mask pattern to form a first contact hole exposing the second landing plug;

forming a second contact hole by cleaning a surface of the first contact hole, wherein an upper part of the second contact hole has a width that is larger than that of a lower part of the second contact hole, wherein the upper part of the second contact hole is surrounded by the second insulating film above the etch stop film and the lower part of the second contact hole is surrounded by the first insulating film below the etch stop film, the second contact hole exposing the second landing plug;

removing the mask pattern; and forming a contact plug by filling the second contact hole, wherein the contact plug is electrically coupled to the second landing plug.

2. The method of claim 1, wherein the first and second insulating films are formed of a High density plasma (HDP) oxide film, or a Spin-on-dielectric (SOD) oxide film.

3. The method of claim 1, wherein the first insulating film is a HDP oxide film, and the second insulating film is a SOD oxide film.

4. The method of claim 3, wherein the HDP oxide film is formed to have a thickness in the range of about 500 Å to 5,000 Å.

5. The method of claim 3, wherein the etch stop film is formed to have a thickness in the range of about 50 Å to 1,000 Å.

6. The method of claim 3, wherein the SOD oxide film is formed to have a thickness in the range of about 500 Å to 6,000 Å.

7. The method of claim 1, wherein the stacked structure is selectively dry-etched.

8. The method of claim 7, wherein the dry etching process is performed under a pressure in the range of about 15 mTorr to 50 mTorr and a power in the range of about 1,000 W to 2,000 W.

9. The method of claim 7, wherein the dry etching process is performed using a gas comprising essentially fluorocarbon and optionally at least one of fluoro hydrocarbon, oxygen and carbon monoxide and optionally an inert gas.

10. The method of claim 1, wherein the cleaning process is performed using a Buffer oxide etchant (BOE), HF, or a combination thereof.

11. A method of fabricating a semiconductor device, the method comprising:

forming a plurality of landing plugs over a semiconductor substrate;

sequentially depositing a first interlayer insulating film, an etch stop film, and a second interlayer insulating film over the semiconductor substrate;

selectively etching the second interlayer insulating film, the etch stop film, and the first interlayer insulating film to form a first contact hole exposing at least one of the landing plugs;

forming a second contact hole by cleaning a surface of the first contact hole, wherein the second contact hole includes an upper part surrounded by the first interlayer insulating film over the etch stop film and a lower part surrounded by the second interlayer insulating film under the etch stop film, the upper part being wider than the lower part; and forming a contact plug by filling the second contact hole with a conductive material.

12. The method of claim 11, further comprising:

forming a bit line over the semiconductor substrate, wherein the bit line is electrically coupled to at least one of the landing plugs.

13. The method of claim 11, further comprising:

forming a capacitor electrically coupled to the contact plug.

* * * * *